United States Patent
Balseanu et al.

(10) Patent No.: US 7,923,386 B2
(45) Date of Patent: Apr. 12, 2011

(54) METHOD TO IMPROVE THE STEP COVERAGE AND PATTERN LOADING FOR DIELECTRIC FILMS

(75) Inventors: Mihaela Balseanu, Sunnyvale, CA (US); Mei-yee Shek, Mountain View, CA (US); Li-Qun Xia, Santa Clara, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/560,941

(22) Filed: Sep. 16, 2009

(65) Prior Publication Data

US 2010/0048030 A1 Feb. 25, 2010

Related U.S. Application Data (63) Continuation of application No. 11/668,911, filed on Jan. 30, 2007, now Pat. No. 7,601,651.

(60) Provisional application No. 60/790,254, filed on Apr. 7, 2006, provisional application No. 60/788,279, filed on Mar. 31, 2006.

(51) Int. Cl.
*H01L 21/31* (2006.01)

(52) U.S. Cl. .................. 438/789; 438/790; 257/E21.24; 257/E21.567

(58) Field of Classification Search .......................... None
See application file for complete search history.

(56) References Cited

U.S. PATENT DOCUMENTS

| | | |
|---|---|---|
| 4,980,018 A | 12/1990 | Mu et al. |
| 5,818,071 A | 10/1998 | Loboda et al. |
| 6,068,884 A | 5/2000 | Rose et al. |
| 6,147,009 A | 11/2000 | Grill et al. |
| 6,159,871 A | 12/2000 | Loboda et al. |
| 6,451,683 B1 | 9/2002 | Farrar |
| 6,465,372 B1 | 10/2002 | Xia et al. |
| 6,486,061 B1 | 11/2002 | Xia et al. |
| 6,514,671 B1 | 2/2003 | Parikh et al. |
| 6,528,432 B1 | 3/2003 | Ngo et al. |
| 6,531,407 B1 | 3/2003 | Huang et al. |
| 6,531,412 B2 | 3/2003 | Conti et al. |
| 6,531,413 B2 | 3/2003 | Hsieh et al. |
| 6,547,977 B1 | 4/2003 | Yan et al. |
| 6,548,899 B2 | 4/2003 | Ross |
| 6,566,278 B1 | 5/2003 | Harvey et al. |
| 6,566,283 B1 | 5/2003 | Pangrle et al. |
| 6,573,572 B2 | 6/2003 | Farrar |
| 6,582,777 B1 | 6/2003 | Ross et al. |
| 6,583,046 B1 | 6/2003 | Okada et al. |

(Continued)

FOREIGN PATENT DOCUMENTS

KR 20050014231 A 2/2005

(Continued)

*Primary Examiner* — Alexander G Ghyka
*Assistant Examiner* — Seahvosh J Nikmanesh
(74) *Attorney, Agent, or Firm* — Patterson & Sheridan, LLP (57) ABSTRACT

A method of forming a layer on a substrate in a chamber, wherein the substrate has at least one formed feature across its surface, is provided. The method includes exposing the substrate to a silicon-containing precursor in the presence of a plasma to deposit a layer, treating the deposited layer with a plasma, and repeating the exposing and treating until a desired thickness of the layer is obtained. The plasma may be generated from an oxygen-containing gas.

15 Claims, 6 Drawing Sheets

U.S. PATENT DOCUMENTS

| | | |
|---|---|---|
| 6,583,070 B1 | 6/2003 | Tsui et al. |
| 6,583,489 B2 | 6/2003 | Wang et al. |
| 6,593,247 B1 | 7/2003 | Huang et al. |
| 6,632,735 B2 | 10/2003 | Yau et al. |
| 6,717,265 B1 | 4/2004 | Ingerly et al. |
| 6,743,732 B1 | 6/2004 | Lin et al. |
| 6,762,127 B2 | 7/2004 | Boiteux et al. |
| 6,800,566 B2 | 10/2004 | Lu et al. |
| 6,825,134 B2 | 11/2004 | Law et al. |
| 6,846,756 B2 | 1/2005 | Pan et al. |
| 6,858,923 B2 | 2/2005 | Xia et al. |
| 6,921,727 B2 | 7/2005 | Chiang et al. |
| 2002/0081811 A1* | 6/2002 | Foglietti et al. ............... 438/341 |
| 2002/0110695 A1 | 8/2002 | Yang et al. |
| 2003/0073321 A1 | 4/2003 | Boiteux et al. |
| 2003/0077857 A1 | 4/2003 | Xia et al. |
| 2003/0077916 A1 | 4/2003 | Xu et al. |
| 2003/0109143 A1 | 6/2003 | Hsieh et al. |
| 2003/0189208 A1 | 10/2003 | Law et al. |
| 2004/0077164 A1 | 4/2004 | Kornegay et al. |
| 2004/0266216 A1 | 12/2004 | Li et al. |
| 2005/0003676 A1 | 1/2005 | Ho et al. |
| 2005/0024630 A1 | 2/2005 | Ohno et al. |
| 2005/0042889 A1 | 2/2005 | Lee et al. |
| 2005/0065698 A1 | 3/2005 | Bertrand |
| 2005/0070128 A1 | 3/2005 | Xia et al. |
| 2005/0100682 A1 | 5/2005 | Fukiage et al. |
| 2005/0118837 A1* | 6/2005 | Todd et al. .................... 438/791 |
| 2005/0139937 A1* | 6/2005 | Kamiyama et al. ........... 257/410 |
| 2005/0181623 A1 | 8/2005 | Bencher et al. |
| 2005/0230834 A1 | 10/2005 | Schmitt et al. |
| 2005/0255697 A1 | 11/2005 | Nguyen et al. |
| 2006/0046427 A1 | 3/2006 | Ingle et al. |
| 2006/0046479 A1* | 3/2006 | Rajagopalan et al. ........ 438/683 |
| 2006/0046519 A1 | 3/2006 | Tsuji et al. |
| 2006/0154493 A1 | 7/2006 | Arghavani et al. |

FOREIGN PATENT DOCUMENTS

| | | |
|---|---|---|
| KR | 20060059913 | 6/2006 |
| WO | WO-9941423 | 8/1999 |
| WO | WO-2005020310 A1 | 3/2005 |

\* cited by examiner

METHOD TO IMPROVE THE STEP COVERAGE AND PATTERN LOADING FOR DIELECTRIC FILMS

CROSS-REFERENCE TO RELATED APPLICATIONS

This application is a continuation application of co-pending U.S. patent application Ser. No. 11/668,911, filed Jan. 30, 2007, which application claims benefit of U.S. provisional patent application Ser. No. 60/790,254, filed Apr. 7, 2006, and claims benefit of U.S. provisional patent application Ser. No. 60/788,279, filed Mar. 31, 2006, all of which are herein incorporated by reference.

BACKGROUND OF THE INVENTION

1. Field of the Invention

Embodiments of the present invention generally relate to a method and apparatus for semiconductor processing. Specifically, embodiments of the present invention relate to a method and apparatus for depositing a conformal dielectric film.

2. Description of the Related Art

Forming dielectric layers on a substrate by chemical reaction of gases is one of the primary steps in the fabrication of modern semiconductor devices. These deposition processes include chemical vapor deposition (CVD) as well as plasma enhanced chemical vapor deposition (PECVD), which uses plasma in combination with traditional CVD techniques.

CVD and PECVD dielectric layers can be used as different layers in semiconductor devices. For example, the dielectric layers may be used as intermetal dielectric layers between conductive lines or interconnects in a device. Alternatively, the dielectric layers may be used as barrier layers, etch stops, or spacers, as well as other layers.

Dielectric layers that are used for applications such as barrier layers and spacers are typically deposited over features, e.g., horizontal interconnects for subsequently formed lines, vertical interconnects (vias), gate stacks, etc., in a patterned substrate. Preferably, the deposition provides a conformal layer. However, it is often difficult to achieve conformal deposition.

For example, it is difficult to deposit a barrier layer over a feature with few or no resulting surface defects or feature deformation. During deposition, the barrier layer material may overloaf, that is, deposit excess material on the shoulders of a via and deposit too little material in the base of the via, forming a shape that looks like the side of a loaf of bread. The phenomena is also known as footing because the base of the via has a profile that looks like a foot. In extreme cases, the shoulders of a via may merge to form a joined, sealed surface across the top of the via. The film thickness non-uniformity across the wafer can negatively impact the drive current improvement from one device to another. Modulating the process parameters alone does not significantly improve the step coverage and pattern loading problems.

Deposition of conformal layers over gate stacks to provide layers that are subsequently etched to form spacers is also challenging. While methods of depositing silicon nitride and silicon oxide layers for spacers using high temperature, low pressure conventional CVD have been developed, the thermal budget for such techniques is becoming too high as semiconductor device geometry continues to shrink. PECVD processes of silicon nitride and silicon oxide deposition can be performed at lower temperatures, but the step coverage and pattern loading results are not as desirable as those obtained with high temperature, low pressure CVD.

Therefore, a need exists for method of depositing conformal films over formed features in a patterned substrate.

SUMMARY OF THE INVENTION

Embodiments of the present invention provide a method for forming a dielectric film on a substrate comprising placing a substrate with at least one formed feature across a surface of the substrate into a chamber, depositing a dielectric layer, treating the dielectric layer with plasma, determining the thickness of the dielectric layer, and repeating the depositing a dielectric layer, treating the dielectric layer with a plasma, and determining the thickness of the dielectric layer.

In one embodiment, a method of forming a layer on a patterned substrate in a chamber is provided. The method comprises exposing the patterned substrate to a silicon-containing precursor, such as octamethylcyclotetrasiloxane, in the presence of a plasma to deposit a layer on the patterned substrate and treating the layer after it is deposited with a plasma from an oxygen-containing gas, such as oxygen gas. The exposing and treating are repeated until a desired thickness of the layer is obtained. The layer may be a silicon oxide or carbon-doped silicon oxide layer.

In another embodiment, a method of forming a layer on a patterned substrate in a chamber comprises exposing the patterned substrate to a silicon-containing precursor in the presence of a plasma to deposit a layer on the patterned substrate, treating the layer after it is deposited with a plasma from an nitrogen-containing gas, and repeating the exposing and treating until a desired thickness of the layer is obtained.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides a method and apparatus for depositing a conformal dielectric film over a formed feature. The films that can benefit from this process include dielectric materials such as silicon oxide, silicon oxynitride, or silicon nitride. The films may be carbon doped, hydrogen doped, or contain some other chemical or element to tailor the dielectric properties. The layer may be carbon doped or nitrogen doped.

Specifically, a combination of thin layers that have been individually deposited and plasma treated provide a more conformal film than a single thick dielectric layer. The chambers that are preferred for this process include the PRODUCER P3™ chamber, PRODUCER APF PECVD™ chamber, PRODUCER BLACK DIAMOND PECVD™ chamber, PRODUCER BLOK PECVD™ chamber, PRODUCER DARC PECVD™ chamber, PRODUCER HARP™ chamber, PRODUCER PECVD™ chamber, PRODUCER SACVD™ chamber, PRODUCER STRESS NITRIDE PECVD™ chamber, and PRODUCER TEOS FSG PECVD™ chamber, and each of these chambers is commercially available from Applied Materials, Inc. of Santa Clara, Calif. The chambers of this process may be configured individually, but are most likely part of an integrated tool. The process may be performed on any substrate, such as a 200 mm or 300 mm substrate or other medium suitable for semiconductor or flat panel display processing.

Figure 1:
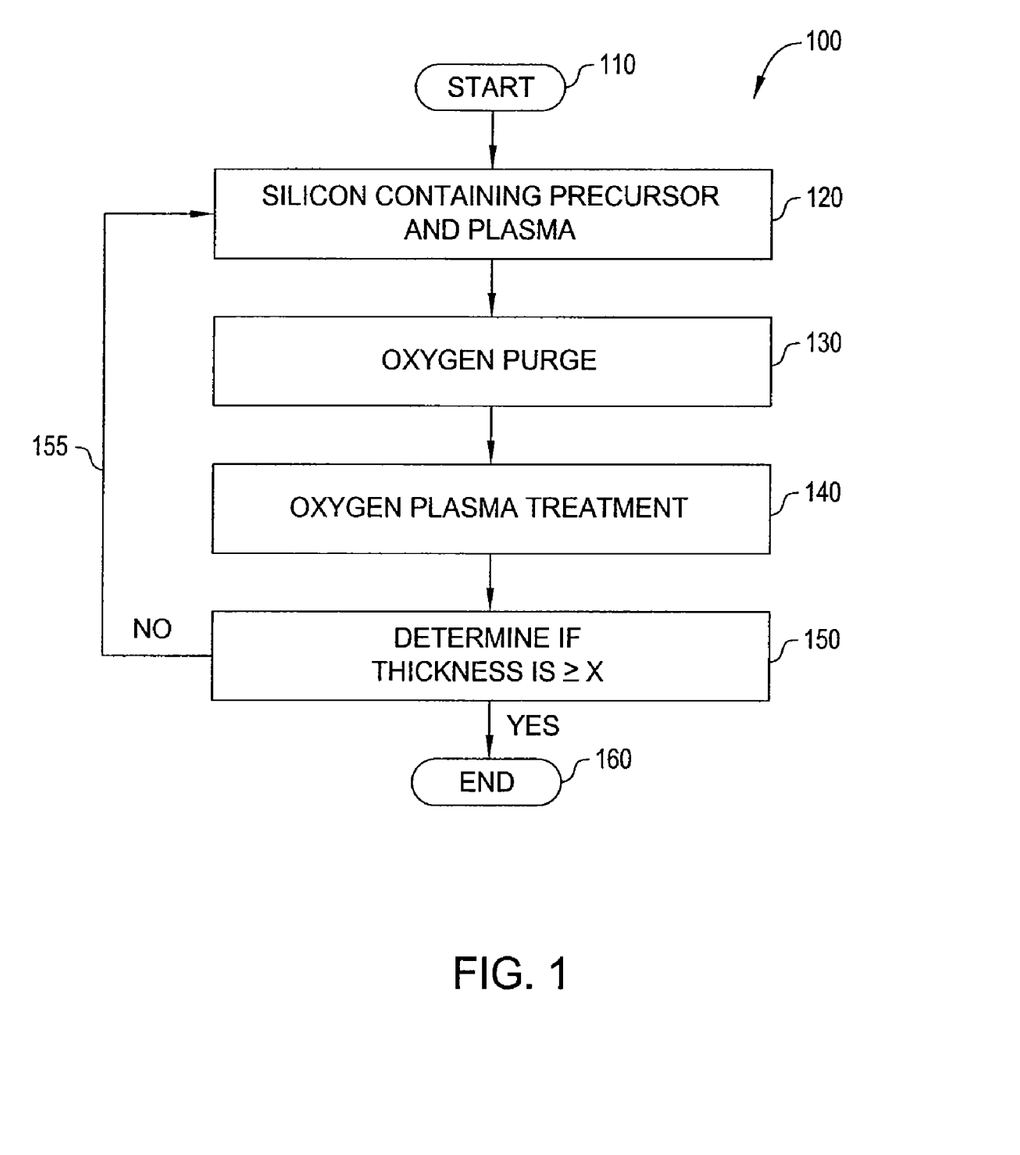
FIG. 1 is a flow chart of an embodiment of a deposition process.

FIG. 1 is a flow chart of an embodiment of a deposition process 100. All of the process steps of deposition process 100 may be performed in the same chamber. The process 100 begins with start step 110 that includes placing a substrate with at least one formed feature across its surface, i.e., a patterned substrate, into a chamber. The formed feature may be any type of formed feature such as a via, interconnect, or gate stack, for example.

Deposition of a dielectric layer is performed by exposing the substrate to a silicon-containing precursor simultaneously with plasma present in the chamber during precursor and plasma step 120. The silicon-containing precursor can include octamethylcyclotetrasiloxane (OMCTS), methyldiethoxysilane (MDEOS), bis(tertiary-butylamino)silane (BTBAS), tridimethylaminosilane (TriDMAS), trisdimethylaminosilane (TrisDMAS), silane, disilane, dichlorosilane, trichlorosilane, dibromosilane, silicon tetrachloride, silicon tetrabromide, or combinations thereof. In one aspect, OMCTS and silane are preferred silicon-containing precursors. The plasma is provided at about 50 W to about 3000 W of RF power at a frequency of 13.56 MHz and/or 350 KHz. Gases that are optionally introduced into the chamber at the same time as the silicon-containing precursor include helium, nitrogen, oxygen, nitrous oxide, and argon. Oxygen and/or helium are the preferred additional gases for introduction to the chamber if an additional gas is used. Helium or other inert gases may be used as a carrier gas.

The plasma, precursor, and optional additional gases introduced during step 120 are followed by the introduction of an oxygen-containing gas, such as oxygen gas or nitrous oxide, to the chamber during oxygen purge step 130. The oxygen purge step 130 is performed by introducing the oxygen-containing gas into the chamber at a time period and partial pressure that are selected to purge the residual silicon-containing precursor and optional additional gases. Next, during oxygen plasma treatment step 140, an oxygen-containing gas, such as oxygen or nitrous oxide, is introduced into the chamber. The plasma is provided at about 50 W to about 3000 W for about 0.1 seconds to about 600 seconds.

Returning to step 120, the silicon-containing precursor may be introduced into the chamber at a flow rate of between about 5 sccm and about 1000 sccm. An optional carrier gas, e.g., helium, may be introduced into the chamber at a flow rate of between about 100 sccm and about 20000 sccm. The ratio of the flow rate of the silicon-containing precursor, e.g., octamethylcyclotetrasiloxane, to the flow rate of the carrier gas, e.g., helium, into the chamber is about 1:1 or greater, such as between about 1:1 and about 1:100. The chamber pressure may be greater than about 5 mTorr, such as between about 1.8 Torr and about 10 Torr, and the temperature of a substrate support in the chamber may be between about 125° C. and about 580° C. while the silicon-containing precursor is flowed into the chamber to deposit the layer. Preferably, the temperature is below about 500° C. The silicon-containing precursor may be flowed into the chamber for a period of time sufficient to deposit a layer having a thickness of between about 5 Å and about 2000 Å. For example, the silicon-containing precursor may be flowed into the chamber for between about 0.1 seconds and about 120 seconds.

The plasma during step 120 may be provided by RF power at between about 50 W and about 3000 W at a frequency of 13.56 MHz or 350 KHz. The RF power may be provided to a showerhead, i.e., a gas distribution assembly, and/or a substrate support of the chamber. The spacing between the showerhead and the substrate support is greater than about 230 mils, such as between about 350 mils and about 800 mils.

The flow of the silicon-containing precursor into the chamber and the RF power are then stopped, and any remaining silicon-containing precursor is purged from the chamber by introducing an oxygen-containing gas, such as oxygen gas, nitrous oxide, or a combination thereof into the chamber in step 130. The oxygen-containing gas may be introduced into the chamber at a flow rate of between about 100 and about 20000 sccm. The oxygen-containing gas may be flowed into the chamber for a period of time such as between about 0.1 seconds and about 60 seconds. The chamber pressure may be between about 5 mTorr and about 10 Torr, and the temperature of a substrate support in the chamber may be between about 125° C. and about 580° C. while the oxygen-containing gas is flowed into the chamber.

After the chamber is purged, an oxygen plasma treatment is performed in the chamber to treat the layer that is deposited on the substrate from the silicon-containing precursor, as described in step 140. The oxygen-containing gas may be introduced into the chamber at a flow rate of between about 100 and about 20000 sccm. The oxygen-containing gas may be flowed into the chamber for a period of time such as between about 0.1 seconds and about 120 seconds. The oxygen plasma may be provided by applying a RF power of between about 50 W and about 3000 W in the chamber at a frequency of 13.56 MHz and/or 350 KHz. The chamber pressure may be between about 5 mTorr and about 10 Torr, and the temperature of a substrate support in the chamber may be between about 125° C. and about 580° C. while the oxygen-containing gas is flowed into the chamber.

The oxygen plasma treatment may be terminated by interrupting the RF power and the flow of the oxygen-containing gas into the chamber. Optionally, the thickness of the deposited dielectric layer is then analyzed or estimated during thickness determination step 150. If the thickness of the deposited layer or layers is equal to or greater than a given desired thickness, the process 100 is completed during end step 160. During end step 160, the substrate undergoes additional processing and is removed from the chamber. If the thickness is not equal to or greater than a given desired thickness, then the deposition step 120 and plasma treatment step 130 are repeated during repeat process 155. The thickness determination step 140 and repeat process 155 may be repeated multiple times until the desired film thickness is obtained, for example, about 1 to about 6 repetitions may be performed.

If the thickness is not equal to or greater than a given desired thickness, the flow of the silicon-containing precursor into the chamber is then resumed to deposit an additional amount of the dielectric layer. The chamber is purged and then an oxygen plasma treatment as described above is performed. Multiple cycles of deposition, purging, and plasma treatment may be performed until the desired thickness of dielectric layer is obtained.

Experimental tests of a process similar to FIG. 1 using OMCTS as the silicon-containing precursor and helium were performed. The film deposition rate and ratio of methyl groups to oxygen groups present in the resulting film were plotted as a function of plasma power. The deposition rate reached a plateau at about 300 W, and the ratio of methyl groups to oxygen groups was lowest at about 400 W when RF power of 0 to 400 W was used.

Several combinations of helium and OMCTS were tested to determine the best ratio for depositing a dielectric layer. A ratio of about twice as much helium to OMCTS as the silicon containing precursor and additional gas yielded a film with the greatest film thickness. Also, scanning electron micrographs of a film deposited with OMCTS, a film deposited with OMCTS and oxygen plasma at 90 mTorr, and a film deposited with OMCTS and oxygen plasma at 2 Torr indicate that the film deposited with OMCTS and oxygen plasma at 2 Torr provides the best pattern loading effect results and step coverage of the three films.

Nitrous oxide and oxygen were compared for use in the oxygen plasma treatment step 140. Scanning electron micrographs of a film deposited using a nitrous oxide plasma and a film deposited using an oxygen plasma indicate that the film deposited using an oxygen plasma had the better pattern loading effect and step coverage of the two films.

Figure 2:
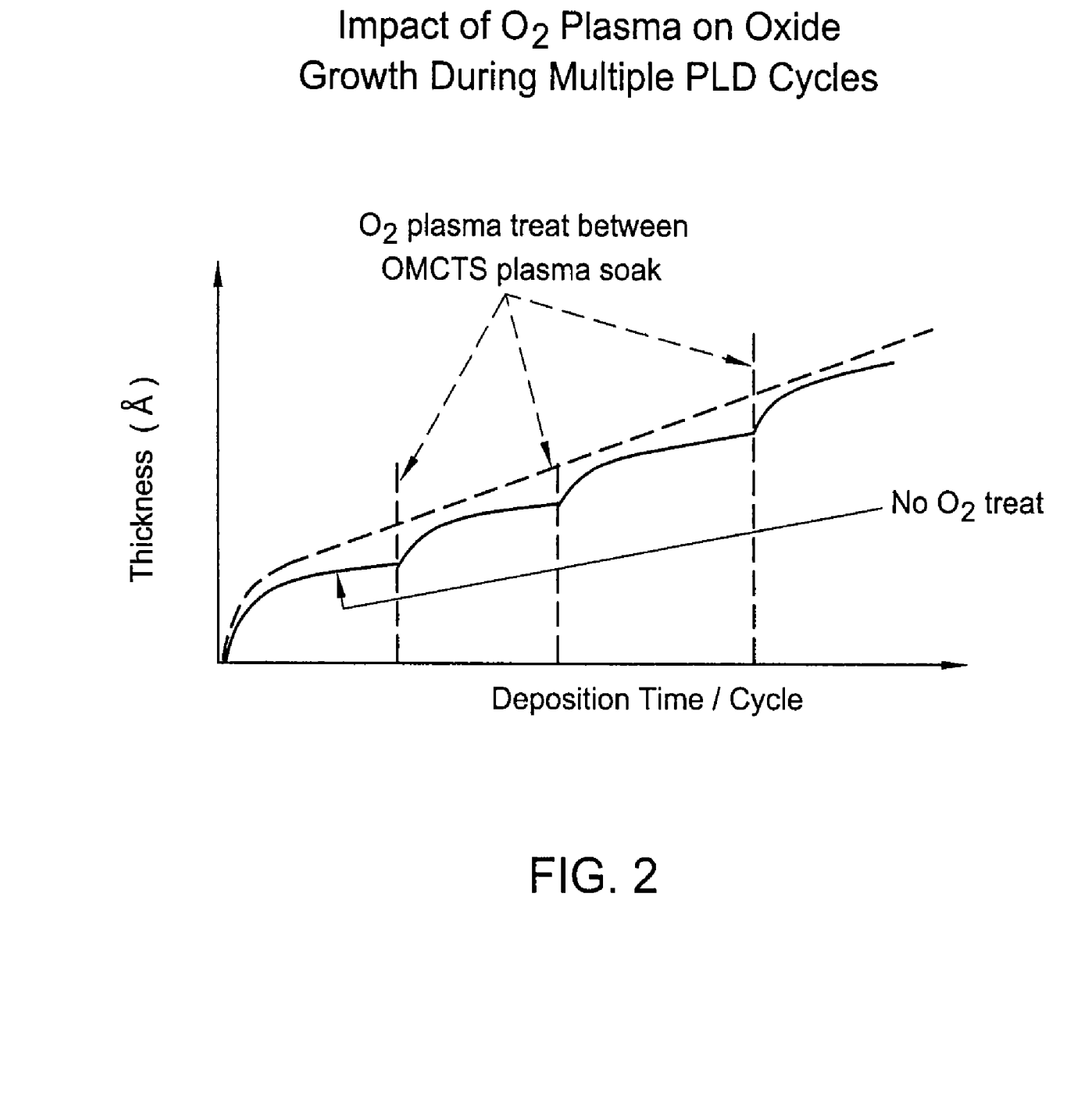
FIG. 2 is a graph showing the thickness of a layer during a deposition process performed according to an embodiment of the invention.
Figure 3:
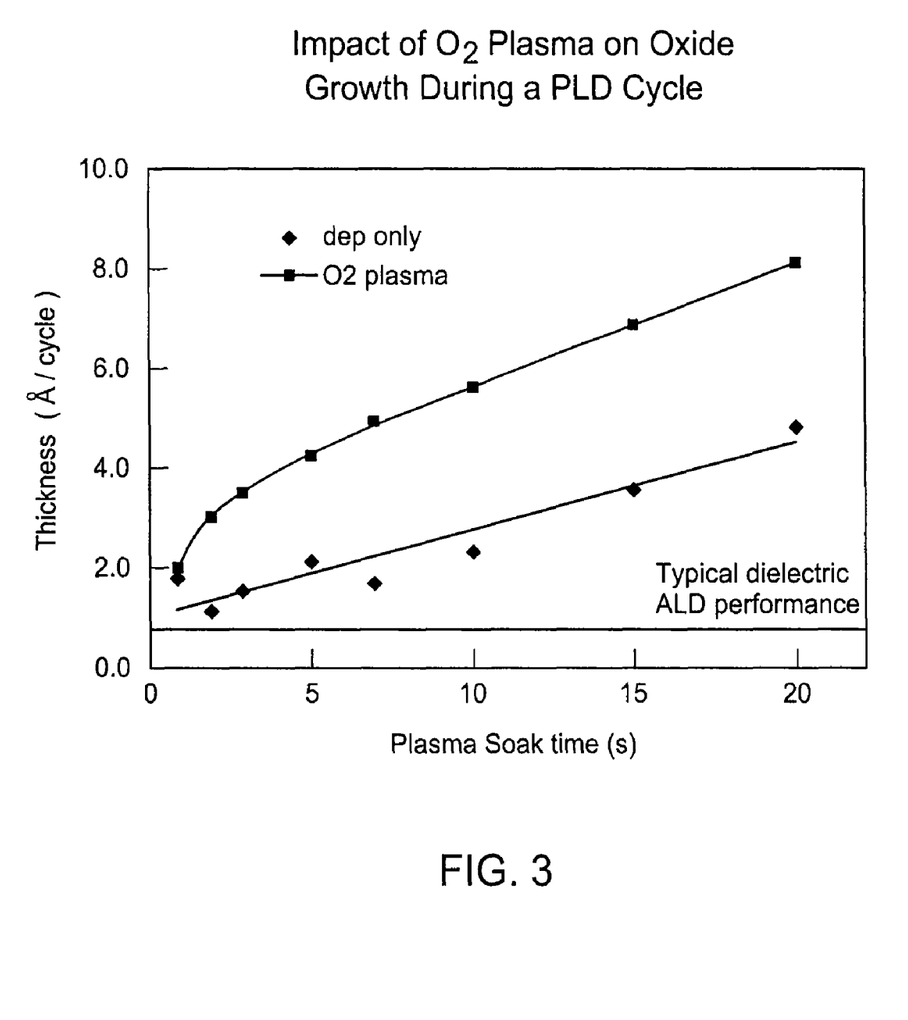
FIG. 3 is a graph showing the thickness of a layer deposited on a substrate according to an embodiment of the invention relative to the amount of time the substrate is exposed to a precursor.

In one aspect, the embodiment described with respect to FIG. 1 is a pulsed layer deposition (PLD), as pulses of the silicon-containing precursor separated by oxygen plasma treatments provide sequentially deposited thin layers that form a complete layer. FIG. 2 is a graph showing the thickness of a layer during a dielectric deposition performed using the cycles of deposition and plasma treatment described above relative to the deposition time or cycle number. The points at which the plasma treatments are performed are indicated on the graph. FIG. 2 shows that in a similar process that did not include the plasma treatments, there were periods in which the deposition rate was noticeably decreased, while the process provided herein did not exhibit such periods. FIG. 3 shows that the thickness deposited per period of time of flowing the silicon-containing precursor (OMCTS) into the chamber in the presence of a plasma (plasma soak time in FIG. 3) in a similar process that did not include the plasma treatments (dep only in FIG. 3) was less than the thickness deposited per period of time of flowing the silicon-containing precursor into the chamber in the presence of a plasma in a process that includes the plasma treatments according to an embodiment of the invention. It is noted that deposition rates approximately 10-fold higher than deposition rates for atomic layer deposition (ALD) processes have been obtained using processes according to embodiments of the invention. Furthermore, it is noted that the processes described herein can be performed in conventional chemical vapor deposition chambers, such as PRODUCER PECVD™ chambers.

Figure 4:
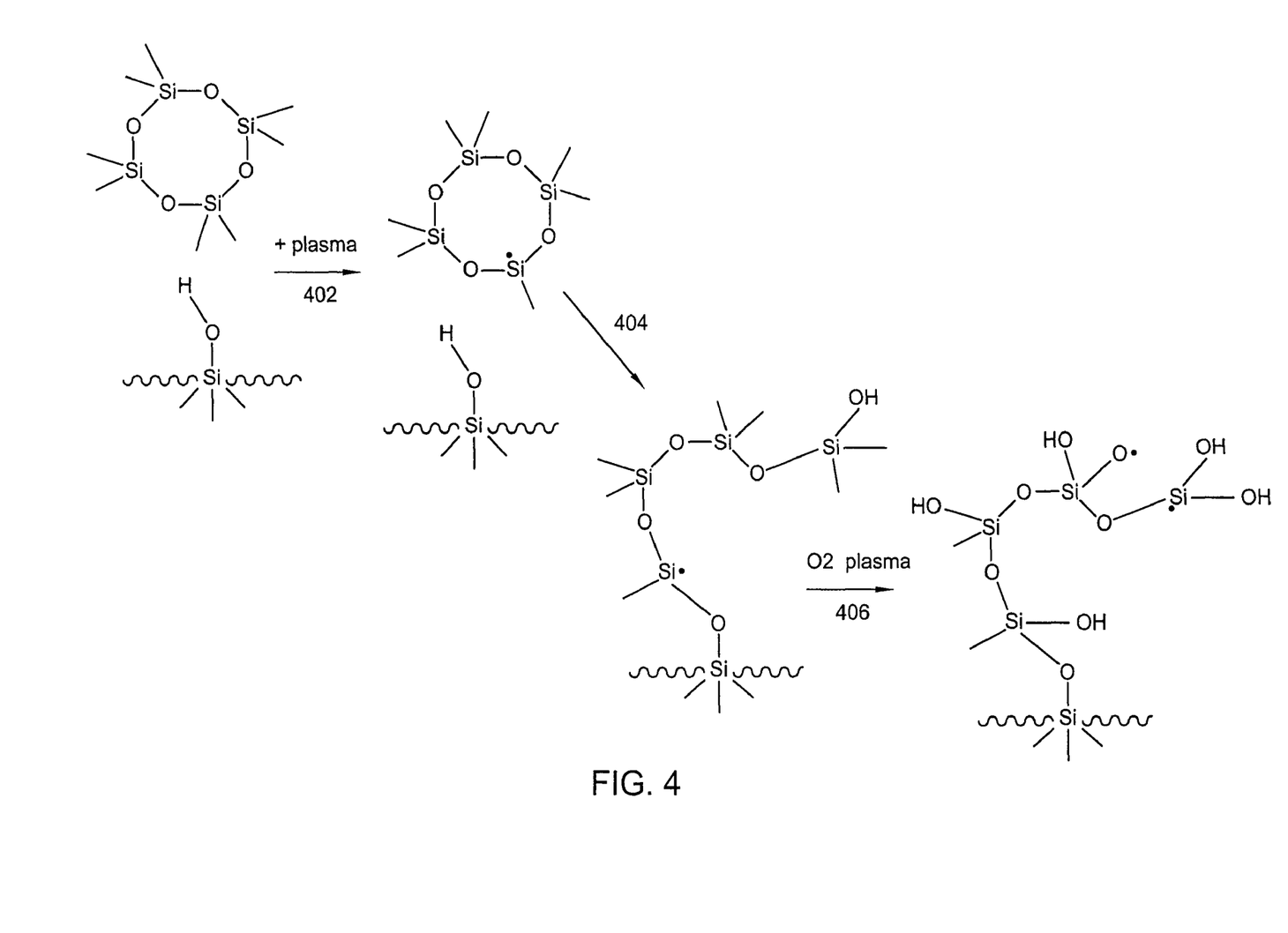
FIG. 4 is a schematic diagram of the deposition of a layer on a substrate according to an embodiment of the invention.

It is believed that the oxygen plasma treatment enhances the deposition rate by removing methyl groups ($-CH_3$) that are retained in the deposited layer, as it has been observed that the presence of methyl groups in the deposited layer can hinder further deposition. The oxygen plasma treatment replaces at least some if not many of the methyl groups in the deposited layer with hydroxyl groups ($-OH$) that can serve as nucleation sites for the attachment of another layer of the silicon-containing precursor. FIG. 4 shows an example of the effect of an oxygen plasma treatment on a layer that is deposited from octamethylcyclotetrasiloxane (OMCTS). For simplicity, only one OMCTS molecule of the layer is shown. In step 402 of FIG. 4, OMCTS is reacted in the presence of a plasma and a substrate containing a Si—OH bond. The plasma forms an OMCTS radical. The OMCTS radical then attaches to the hydroxyl group of the substrate, as shown in step 404. In step 406, an oxygen plasma treatment with oxygen gas replaces at least some of the methyl groups in the deposited OMCTS layer with hydroxyl groups.

It has been found that using the RF power levels, spacing, pressure, and flow rate ratios described above, a thin, uniform dielectric layer having a thickness of only between about 3 Å and about 25 Å can be reliably deposited when a self-saturating precursor is used as a precursor to deposit the layer. A 1 Å thickness range of the layer within a single 300 mm substrate has been obtained using the conditions provided herein. As defined herein, a "self-saturating precursor" is a precursor that deposits one thin layer, e.g., one molecular layer of the precursor, on a substrate. The presence of the thin dielectric layer hinders the further deposition of additional layers of the dielectric material from the precursor under the processing conditions used to deposit the thin layer. OMCTS is a preferred self-saturating precursor as it contains a large number of methyl groups that result in a self-saturating deposition of layer. In other words, a conformal first layer may be deposited from OMCTS because as soon as the surface of the underlying substrate is covered with OMCTS molecules, the presence of the Si—$CH_3$ bonds at the surface of the deposited layer substantially hinders further deposition until some of the methyl groups are removed by the oxygen plasma treatment described above. Thus, the deposition of each molecular layer of OMCTS can be well controlled, which enhances the step coverage of the final layer.

Scanning electron microscope images confirm that processes according to FIGS. 1-4 provide improved step coverage and reduced pattern loading relative to layers deposited using conventional plasma enhanced chemical vapor deposition processes.

The deposition of an oxide layer deposited according to an embodiment of the invention was measured on the side, bottom, and top of features in patterned substrates having regions with a high density of features (dense areas) and low density of features (isolated areas). A sidewall/top coverage of 75% was achieved in dense areas, and a sidewall/top coverage of 80% was achieved in isolated areas. A bottom/top coverage of 85% was achieved in dense areas, and a bottom/top coverage of 95% was achieved in isolated areas. 0% pattern loading effect (PLE) was observed for the top of features, and only 10% PLE was observed was for the sidewall and bottom of features. In one example, an oxide layer was deposited to a top thickness of 420 Å in a feature having an aspect ratio of 3.5. The thickness of the layer on the sidewall was 275 Å, and the thickness on the bottom was 345 Å. Thus, the sidewall/top step coverage was 66%, the bottom/top step coverage was 83%, and the sidewall/bottom step coverage was 80%. In another example, a low dielectric constant carbon-doped oxide film was deposited to a top thickness of 340 Å in a feature having an aspect ratio of 3.5. The thickness of the layer on the sidewall was 125 Å, and the thickness on the bottom was 210 Å. Thus, the sidewall/top step coverage was 35%, the bottom/top step coverage was 60%, and the sidewall/bottom step coverage was 58%.

While the embodiments and results above have been discussed primarily with respect to using OMCTS as the silicon-containing precursor to deposit silicon oxide or carbon-doped silicon oxide films, other silicon-containing precursors may be used. Other silicon-containing precursors that include a Si—O or Si—N backbone and one or more alkyl groups attached to the silicon atoms may also be used. Additionally, other plasma treatments may be used to form other films. For example, a silicon-containing precursor may be used to deposit a layer that is nitrogen plasma treated to provide a conformal SiN layer, as described below with respect to FIGS. 5 and 6.

Figure 5:
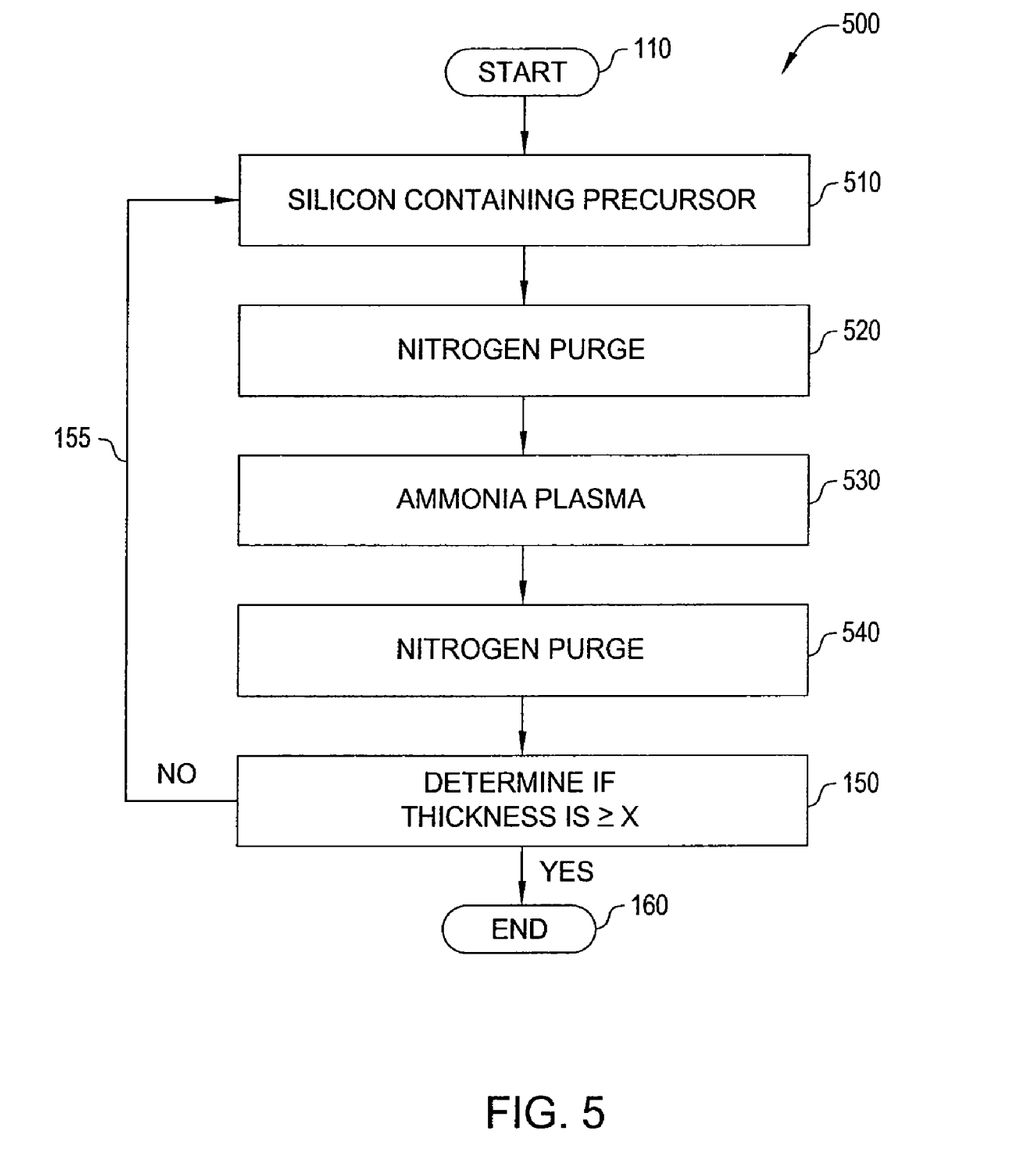
FIG. 5 is a flow chart of an additional embodiment of a deposition process.

FIG. 5 is a flow chart of an embodiment of a deposition process 500. The start step 110, the thickness determination step 150, the repeat step 155, and the end step 160 are described above. During deposition step 510, a silicon-containing precursor is introduced into the chamber. The silicon-containing precursor can include octamethylcyclotetrasiloxane (OMCTS), methyldiethoxysilane (MDEOS), bis(tertiary-butylamino)silane (BTBAS), tridimethylaminosilane (TriDMAS), trisdimethylaminosilane (TrisDMAS), silane, disilane, dichlorosilane, trichlorosilane, dibromosilane, silicon tetrachloride, silicon tetrabromide, or combinations thereof. Silane is a preferred precursor for deposition process 500. The deposition step 510 may be performed for about 2 to about 5 seconds. Next, during step 520, nitrogen is introduced into the chamber to purge the chamber. Then, during step 530, ammonia is used to provide plasma to the chamber. Then, during step 540, another nitrogen purge is performed. The time for one cycle of steps 510 to 140 is about 60 seconds per cycle and the deposition rate is about 2 Å per cycle. The process 500 provides conformal coverage that is controlled by the purge efficiency, that is, how effectively the purge removes the silicon-containing precursor before the ammonia plasma.

Figure 6:
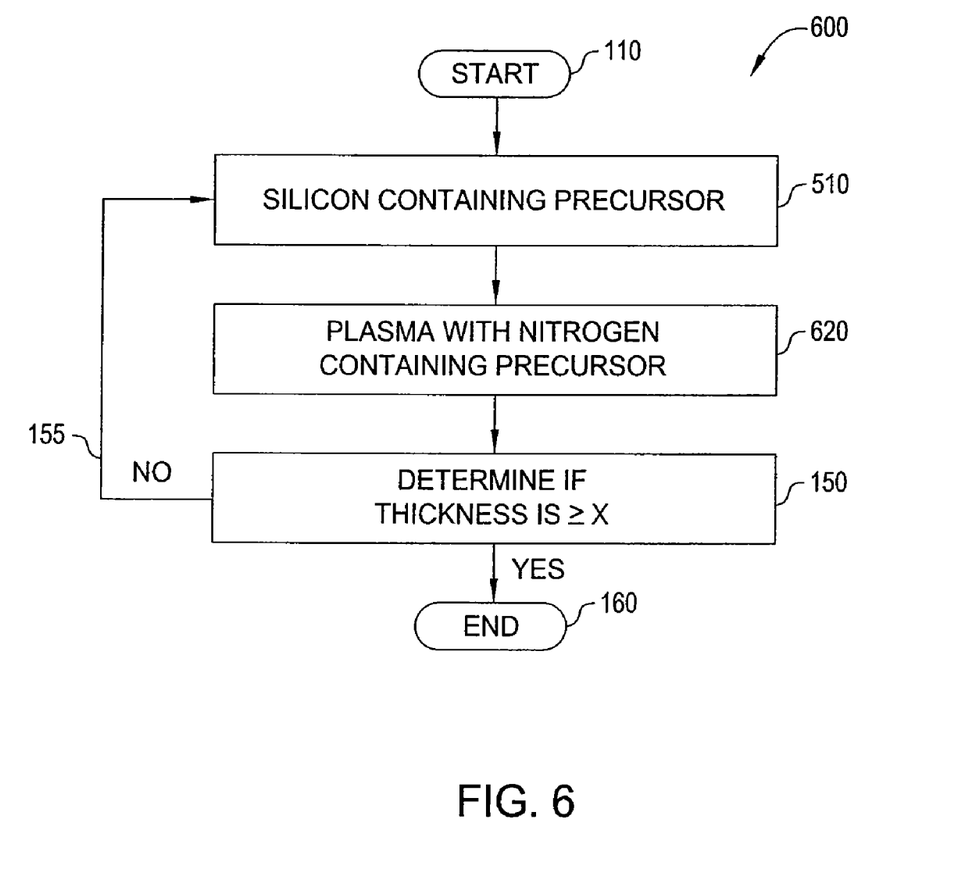
FIG. 6 is a flow chart of an additional embodiment of a deposition process.

FIG. 6 is a flow chart of an additional embodiment of a deposition process 600. The start step 110, the thickness determination step 150, the repeat step 155, the end step 160, and silicon-containing precursor step 510 are described above. After the silicon-containing precursor step 510, an optional nitrogen purge step (not shown) may be performed. Next, during plasma step 620, plasma of a nitrogen-containing precursor is introduced to the chamber. The nitrogen containing precursor may include nitrogen, ammonia, or nitrous oxide. Ammonia is a preferred nitrogen-containing precursor. The time for one cycle of steps 410 to 150 is about 30 seconds for deposition process 600. The deposition rate is about 3.5 Å per cycle.

The conformal layers provided according to embodiments of the invention may be used as different layers in semiconductor devices. For example, they may be used as layers that are deposited and then subsequently etched to form spacers around a gate stack of a transistor, or they may be used as barrier layers.

An advantage of the processes described above is that they result in films with improved step coverage and a reduced pattern loading effect. The process cycles can be performed in the same chamber and thus require less processing time than processes requiring multiple chambers. The overall thermal budget and individual substrate process temperatures are lower than in processes that do not use plasma.

While the foregoing is directed to embodiments of the present invention, other and further embodiments of the invention may be devised without departing from the basic scope thereof, and the scope thereof is determined by the claims that follow.

What is claimed is:

1. A method of forming a dielectric layer on a patterned substrate in a chamber, comprising:
   exposing the patterned substrate to a silicon-containing precursor in the presence of a plasma to deposit a carbon doped silicon oxide layer on the patterned substrate;
   purging the silicon-containing precursor from the chamber;
   treating the carbon doped silicon oxide layer with a plasma from an oxygen-containing gas; and
   repeating the exposing the patterned substrate to the silicon-containing precursor in the presence of the plasma to deposit the carbon doped silicon oxide layer, the purging the silicon-containing precursor from the chamber, and the treating the carbon doped silicon oxide layer until a desired thickness of the dielectric layer is obtained, wherein the silicon-containing precursor comprises one or more alkyl groups bonded to silicon.

2. The method of claim 1, wherein the oxygen-containing gas comprises oxygen gas, nitrous oxide, or a combination thereof.

3. The method of claim 2, wherein the oxygen-containing gas comprises oxygen gas.

4. The method of claim 1, wherein the treating the carbon doped silicon oxide layer with a plasma from an oxygen-containing gas comprises removing methyl groups from the carbon doped silicon oxide layer.

5. The method of claim 4, wherein the treating the carbon doped silicon oxide layer with a plasma from an oxygen-containing gas further comprises adding hydroxyl groups to the silicon-containing layer.

6. The method of claim 1, wherein the carbon doped silicon oxide layer is treated with the plasma from an oxygen-containing gas at an RF power of between about 50 W and about 3000 W for a period of between about 0.1 seconds and about 120 seconds.

7. The method of claim 1, wherein the dielectric layer is a barrier layer.

8. The method of claim 1, further comprising etching the dielectric layer to form a spacer around a gate stack after the desired thickness of the dielectric layer is obtained.

9. The method of claim 1, wherein treating the carbon doped silicon oxide layer with a plasma comprises applying RF power.

10. The method of claim 9, further comprising terminating the treating the carbon doped silicon oxide layer with a plasma by interrupting the RF power and the oxygen-containing gas before the repeating the exposing the patterned substrate to deposit the carbon doped silicon oxide layer and the treating the carbon doped silicon oxide layer.

11. The method of claim 1, wherein the silicon-containing precursor is selected from the group consisting of methyldiethoxysilane, bis(tertiary-butylamino) silane, tridimethylaminosilane, trisdimethylaminosilane, and the oxygen-containing gas is selected from the group consisting of oxygen gas and nitrous oxide.

12. A method of forming a dielectric layer on a patterned substrate in a chamber, comprising:
   exposing the patterned substrate to a nitrogen-containing and silicon-containing precursor in the presence of a plasma to deposit a silicon nitride layer on the patterned substrate;
   purging the nitrogen-containing and silicon-containing precursor from the chamber;
   treating the silicon nitride layer with a plasma from oxygen gas; and
   repeating the exposing the patterned substrate to a nitrogen-containing and silicon-containing precursor in the presence of the plasma to deposit the silicon nitride layer, the purging the nitrogen-containing and silicon-containing precursor from the chamber, and the treating the silicon nitride layer until a desired thickness of the dielectric layer is obtained, wherein the nitrogen-containing and silicon-containing precursor is selected from the group consisting of bis(tertiary-butylamino)silane, tridimethylaminosilane, trisdimethylaminosilane, and combinations thereof.

13. The method of claim 12, wherein the treating the silicon nitride layer with a plasma from an oxygen gas comprises removing organic functional groups from the silicon nitride layer, and wherein the treating the silicon nitride layer with a plasma from oxygen gas further comprises adding hydroxyl groups to the silicon nitride layer.

14. A method of forming a dielectric layer on a patterned substrate in a chamber, comprising:
    exposing the patterned substrate to a silicon-containing precursor in the presence of a plasma to deposit a silicon-containing layer on the patterned substrate;
    purging the silicon-containing precursor from the chamber;
    treating the silicon-containing layer with a plasma from a nitrogen-containing gas; and
    repeating the exposing the patterned substrate to the silicon-containing precursor in the presence of the plasma to deposit the silicon-containing layer, the purging the silicon-containing precursor from the chamber, and the treating the silicon-containing layer until a desired thickness of the dielectric layer is obtained, wherein the silicon-containing precursor comprises a Si—N backbone and one or more alkyl groups bonded to silicon and the silicon-containing precursor is selected from the group consisting of bis(tertiary-butylamino)silane, tridimethylaminosilane, trisdimethylaminosilane, and combinations thereof.

15. The method of claim 14, wherein the dielectric layer comprises silicon and nitrogen.

* * * * *

UNITED STATES PATENT AND TRADEMARK OFFICE
CERTIFICATE OF CORRECTION

| | | |
|---|---|---|
| PATENT NO. | : 7,923,386 B2 | Page 1 of 1 |
| APPLICATION NO. | : 12/560941 | |
| DATED | : April 12, 2011 | |
| INVENTOR(S) | : Balseanu et al. | |

It is certified that error appears in the above-identified patent and that said Letters Patent is hereby corrected as shown below:

In the Claims:

Column 9, Claim 13, Line 6, please delete "an".

Signed and Sealed this
Fifth Day of July, 2011

David J. Kappos
*Director of the United States Patent and Trademark Office*